US005517129A

United States Patent [19]
Matsui

[11] Patent Number: 5,517,129
[45] Date of Patent: May 14, 1996

[54] HIGH-SPEED DUAL-BUFFERED OUTPUT CIRCUIT

[75] Inventor: Noriyuki Matsui, Kawasaki, Japan

[73] Assignee: Fujitsu Limited, Kanagawa, Japan

[21] Appl. No.: 920,911

[22] Filed: Jul. 28, 1992

[30] Foreign Application Priority Data

Aug. 9, 1991 [JP] Japan .................................. 3-200173

[51] Int. Cl.[6] .............................................. H03K 19/003
[52] U.S. Cl. .............................................. 326/27; 326/28
[58] Field of Search ...................................... 307/443, 451, 307/481, 263; 326/26–28, 98

[56] References Cited

U.S. PATENT DOCUMENTS

| 4,477,741 | 10/1984 | Moser, Jr. ........................ 307/443 X |
|---|---|---|
| 4,527,081 | 7/1985 | Stewart ............................... 307/270 |
| 4,604,731 | 8/1986 | Konishi ............................... 365/203 |
| 4,785,201 | 11/1988 | Martinez ............................. 307/443 |
| 4,820,942 | 4/1989 | Chan .................................... 307/542 |
| 5,039,874 | 8/1991 | Anderson ............................ 307/270 |
| 5,046,048 | 9/1991 | Atsumi et al. ...................... 365/201 |
| 5,057,711 | 10/1991 | Lee et al. ............................ 307/443 |
| 5,063,308 | 11/1991 | Borkar ............................... 307/263 X |
| 5,122,690 | 6/1992 | Bianchi ............................. 307/443 X |
| 5,124,579 | 6/1992 | Naghshineh ....................... 307/443 |
| 5,241,221 | 8/1993 | Fletcher et al. .................. 307/443 X |

Primary Examiner—David R. Hudspeth
Attorney, Agent, or Firm—Staas & Halsey

[57] ABSTRACT

In an output circuit for driving a load connected to an output terminal in accordance with an input signal input to an input terminal, the output circuit connects to the input and output terminals, a first output buffer which operates when activated; connects in parallel to the first output buffer, a second output buffer which, when activated, operates with driving ability higher than the first output buffer; and activates the second output buffer for a predetermined period when the input signal is input and, after the period, activates the first output buffer.

7 Claims, 5 Drawing Sheets

HIGH-SPEED DUAL-BUFFERED OUTPUT CIRCUIT

BACKGROUND OF THE INVENTION

1. Field of the Invention

The present invention relates to an output circuit for driving a load connected thereto.

An output circuit is placed at an output stage of a circuit, such as a memory integrated circuit (IC), and propagates a signal input therefrom out to a load connected to the output circuit. Therefore, a high-speed output circuit with little power consumption and high reliability is in great demand.

2. Description of the Related Art

FIG. 1 is a block diagram of a memory IC with a conventional output circuit.

An address latch 1a latches an incoming memory address signal to address and read one of a plurality of memory cells constituting a memory cell array 2a. An output data latch 3a latches data read from the cell addressed. An output circuit 4a, which is an output buffer (or buffer amplifier) of low driving ability i.e., high impedance, outputs the data latched in the output data latch 3a to (i.e., drive) a load connected thereto.

The output circuit 4a may be an output buffer of high driving ability i.e., high impedance. However, an output buffer of high driving ability draws a large current to drive the load fast and, therefore, consumes large amounts of power and is subject to a damage from a "bus fight" (i.e., a "bus conflict"). A bus fight is a phenomenon where two signals from output circuits collide and temporarily interfere with each other on a data bus.

For the above reasons, an output buffer of low driving ability is usually used as an output circuit to avoid the ill effects of the output buffer of high driving ability.

FIG. 2 is a timing chart illustrating an operation of the output circuit in FIG. 1. The address signal An is latched in the address latch 1a at the leading edge of the first clock pulse to address data in the memory cell array 2a. Data read from the memory cell addressed is output via the output circuit 4a as an data-out (Dn) signal.

As shown in FIG. 2, the data-out signal is blunt and unsteady at its leading and trailing edges, eventually, making propagation delay time (i.e., memory access time T) long. Hereinafter, the access time T is defined, as shown in FIG. 2, as the period from the leading edge of the next clock pulse until the data-out signal becomes steady. The data-out signal becomes blunt and unsteady at the leading and trailing edges because an output buffer of the low driving ability requires time to charge and discharge stray capacitance associated with, for example, the output buffer.

Thus, the output circuit of the related art, which comprises an output buffer of low driving ability, has an unnecessarily long memory access time T (or propagation delay time) and, therefore decreases processing speeds of a memory device and other logical circuits using such output circuit.

SUMMARY OF THE INVENTION

It is an object of the present invention to provide a high speed output circuit which is less power-consuming.

It is another object of the present invention to provide an output circuit which is reliable and trouble-free in the event of a bus fight.

To achieve the above and other objects, the present invention provides a first output buffer, a second output buffer, and activation means.

In an output circuit for driving a load connected to an output terminal in accordance with an input signal input to an input terminal, the first output buffer, which operates when activated, is connected to the input and the output terminals, and the second output buffer which, when activated, operates with driving ability higher than the first output buffer, is connected in parallel to the first output buffer. The activation means activates the second output buffer for a predetermined period when the input signal is input and, after the period, activates the first output buffer.

BRIEF DESCRIPTION OF THE DRAWINGS

Throughout the above-mentioned drawings, identical reference numerals are used to designate the same or similar component parts.

DESCRIPTION OF THE PREFERRED EMBODIMENTS

Figure 1:
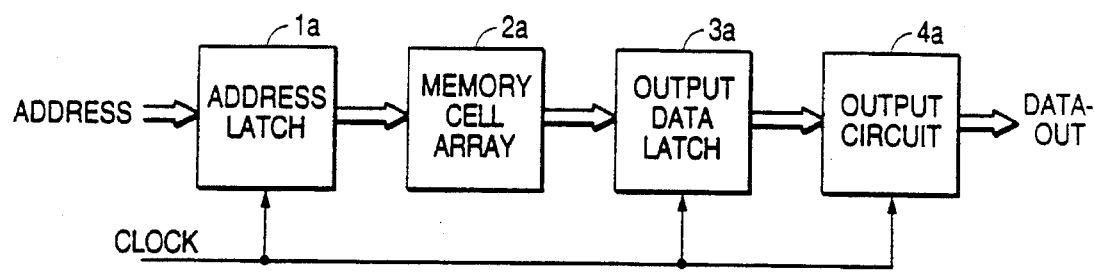
FIG. 1 is a block diagram of a memory IC with a conventional output circuit.
Figure 2:
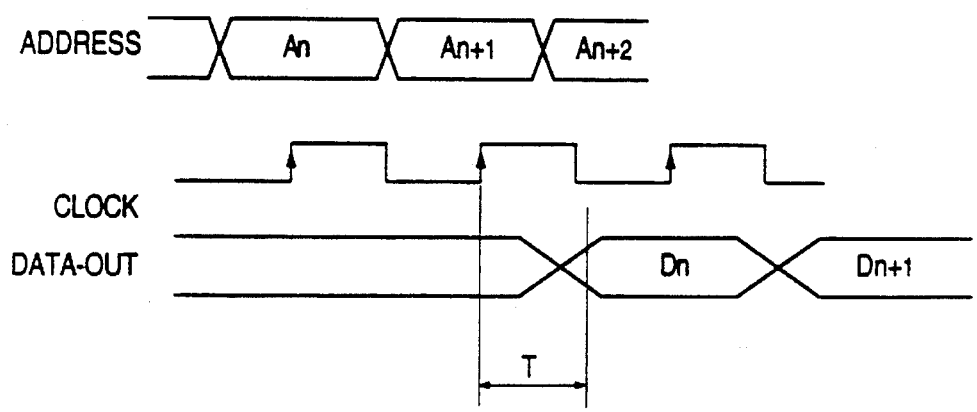
FIG. 2 is a timing chart illustrating an operation of the output circuit in FIG. 1.
Figure 3:
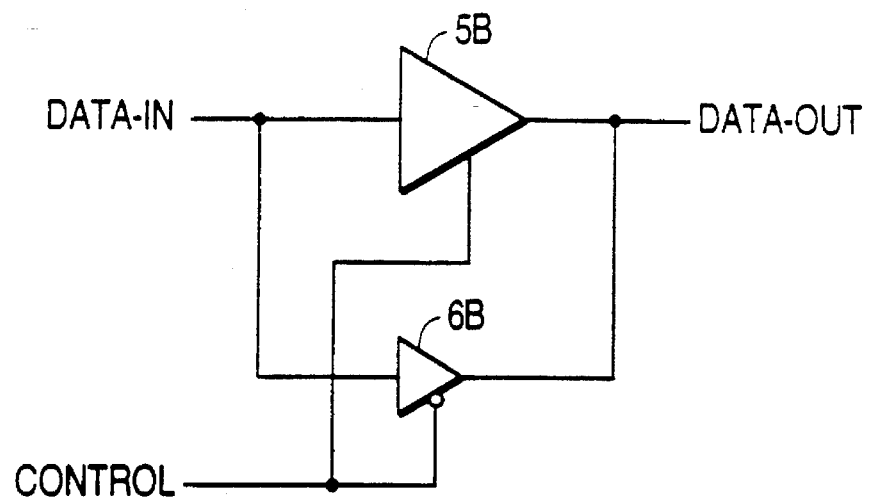
FIG. 3 is a block diagram of an output circuit illustrating the principle of the present invention.

FIG. 3 is a block diagram of an output circuit illustrating the principle of the present invention.

The output circuit is comprised of an output buffer 5B having high driving ability and an output buffer 6B having low driving ability, connected in parallel to each other. A control signal is input to the output buffers 5B and 6B to selectively activate either one of the buffers. A data-in signal is input to the output buffers 5B and 6B, and amplified in the output buffer selected by the control signal and output therefrom as a data-out signal.

Figure 4:
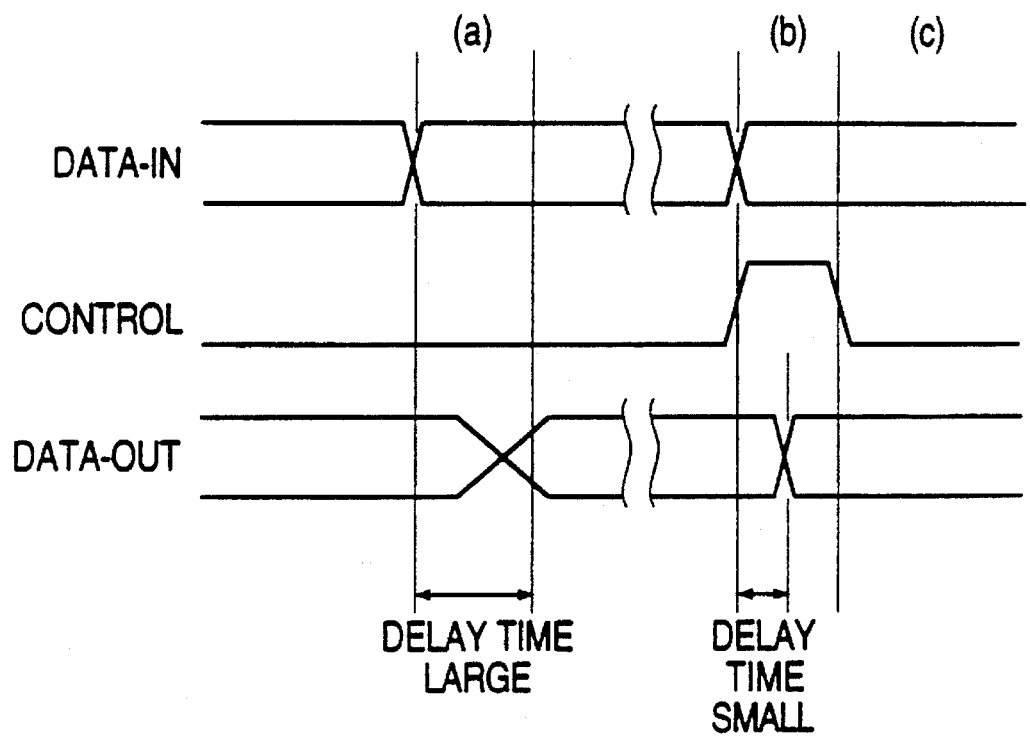
FIG. 4 is a timing chart illustrating the principle of the present invention.

FIG. 4 is a timing chart illustrating the principle of the present invention, which shows a waveform of the data-in, control and the data-out signals to/from the output circuit shown in FIG. 3.

Part (a) shows a waveform when the output buffer 6B is activated by the low-active control signal with the signal level low. The waveform of the data-out signal becomes blunt at the leading and trailing edges, eventually increasing propagation delay time as in the prior art.

Part (b) shows a waveform when the output buffer 5B is activated by the control signal with the signal level high. Since the output buffer 5B drives the loads connected thereto with a large current, the waveform of the data-out signal provides a sharp rise and fall, thus decreasing propagation delay time.

Afterward, when the control signal goes low, the output buffer 6B is activated in turn as shown in part (c). The output buffer 6B holds the data-out signal level established by the output buffer 5B, while consuming less power than the output buffer 5B. Therefore, the output circuit is free from damage even when a bus fight occurs at the trailing edge of the data-out signal.

Figure 5:
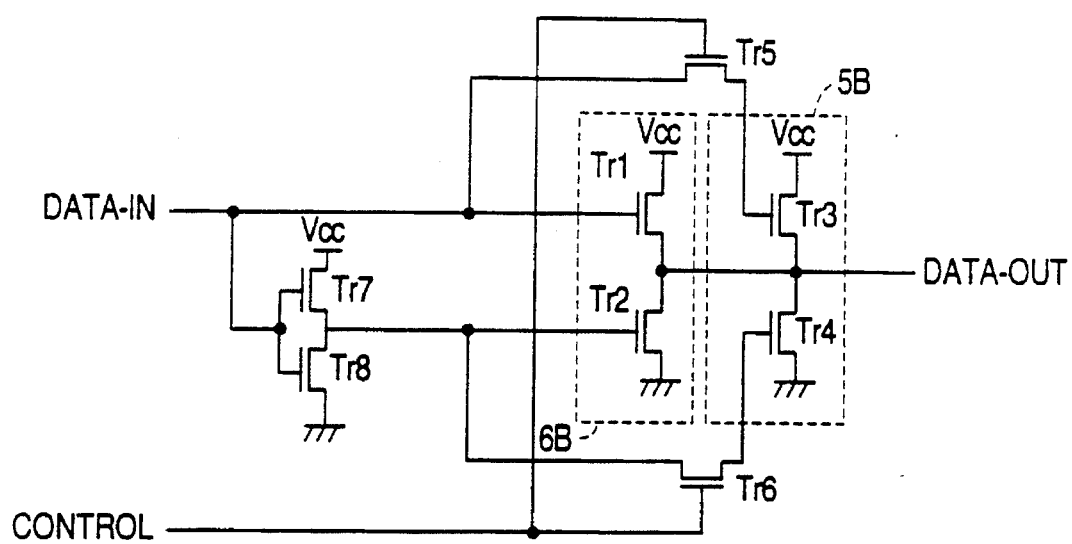
FIG. 5 is a detailed output circuit embodying the present invention.
Figure 6:
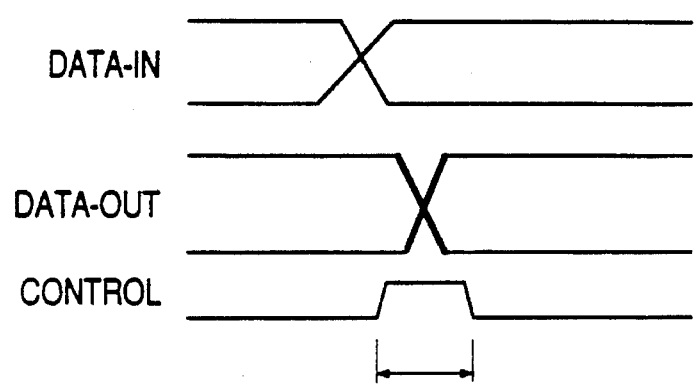
FIG. 6 is a timing chart illustrating an operation of the output circuit shown in FIG. 5.

FIG. 5 is a detailed output circuit embodying the present invention. FIG. 6 is a timing chart illustrating an operation of the output circuit shown in FIG. 5.

The output buffer 6B, of low driving ability, is comprised of pair of n-channel MOS transistors Tr1 and Tr2 connected in series, which have high ohmic resistance when compared to those in the output buffer 5B, and, therefore, are less power-consuming and free from damage during a bus fight.

The output buffer 5B, of high driving ability, is comprised of a pair of n-channel MOS transistors Tr3 and Tr4 connected in series, which have lower ohmic resistance to allow a large current to flow therethrough.

A pair of n-channel MOS transistors Tr7 and Tr8 connected in series constitute an inverter. A pair of n-channel MOS transistors Tr5 and Tr6 act as gates for activating the output buffer 5B when the control signal is high. The control signal is supplied only to the output buffer 5B because it has practically the same effect as if it were supplied to both output buffers 5B and 6B, as explained later.

As is apparent from FIG. 5, transistors Tr1–Tr8 are connected in such a way that only one transistor of each pair conducts at a time.

When the control signal goes high, depending on the data-in signal being high or low, either transistor Tr5 or Tr6 conducts, causing either transistor Tr3 or Tr4 to conduct and, as a result, a high or low level is output as the data-out signal, respectively. For example, when the control signal goes high with the data-in signal high, the transistors Tr5 and then Tr3 conduct, whereby a current flows outward from the power source Vcc of the output buffer 5B through Tr3, and a high level is output as the data-out signal. When the control signal goes high with the data-in signal low, the transistors Tr6 and then Tr4 conduct, whereby a current flows from the outside into the ground of the output buffer 5B through Tr4, and a low level is output as the data-out signal. Thus, when the control signal is high, the output buffer 5B of high driving ability is activated to drive the loads including any stray capacitance. Therefore, the data-in signal is propagated as fast as the data-out signal (shown by the heavy lines in FIG. 6).

When the control signal goes low, the transistors Tr5 and Tr6, and then the transistors Tr3 and Tr4 are cut off.

In the meantime, depending on the data-in signal being high or low (independently of the control signal), either transistor Tr1 or Tr2 of the output buffer 6B conducts, and a high or low level is output as the data-out signal. For example, when the data-in signal is high, the transistor Tr1 conducts, a current flows outward from the power source Vcc of the output buffer 6B through Tr1, and a high level is output as the data-out signal. When the data-in signal is low, the transistor Tr2 conducts, a current flows from the outside into the ground of the output buffer 6B through Tr2, and a low level is output as the data-out signal.

Thus, once the level of the data-out signal is established by the output buffer 5B of high driving ability, the level is maintained by the output buffer 6B of low driving ability, which consumes less power even after the control signal goes low (shown by the fine lines following the heavy ones in FIG. 6). This is because the output buffer 6B need only supply energy required for holding the level.

Figure 7:
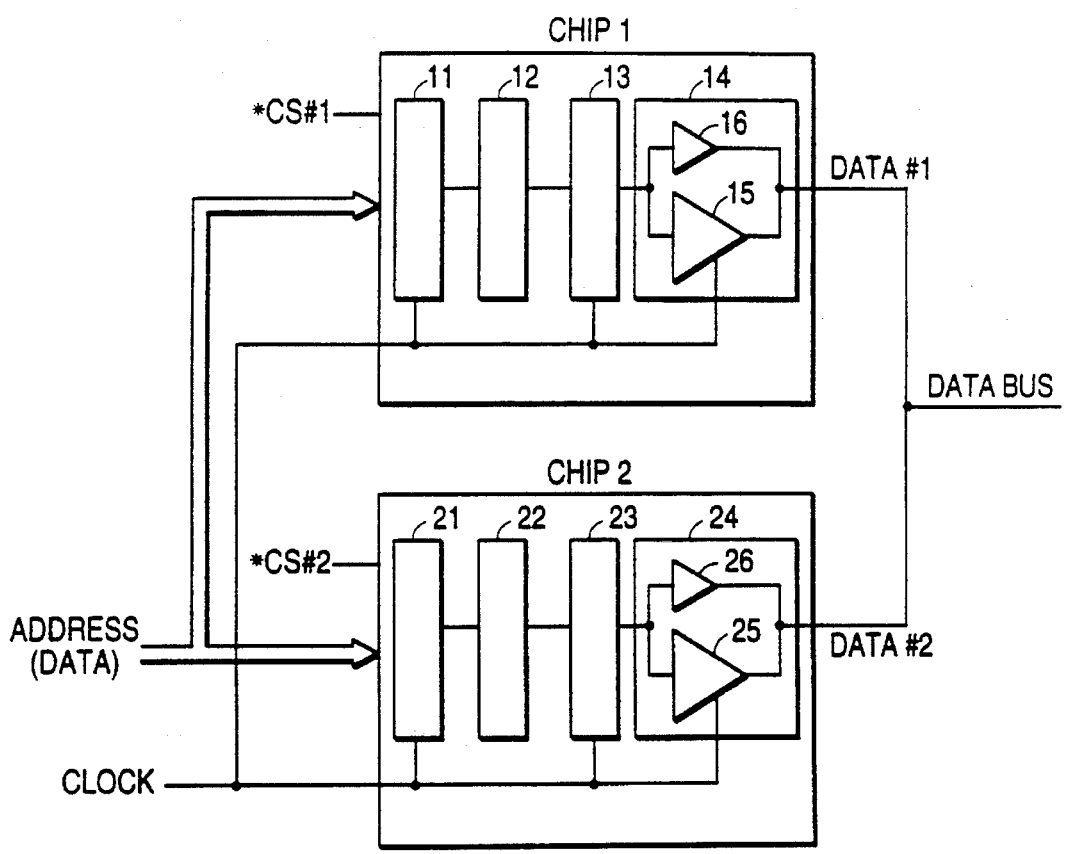
FIG. 7 is a block diagram of a memory device including an output circuit embodying the present invention.

FIG. 7 is a block diagram of a memory device including an output circuit embodying the present invention.

For a synchronous-type SRAM including an STRAM (self-timed static RAM) and a static RAM (SRAM) with a built-in address latch, which inputs a clock signal for internal control, the clock signal can be used for the above-mentioned control signal for activating the output buffers 5B.

A synchronous-type SRAM chip is described herein as an example of the memory device. For easy understanding, only two chips (chips 1 and 2) are shown, each including an address latch 11 (21), a memory cell array 12 (22), an output data latch 13 (23) and an output circuit 14 (24). The output circuit 14 (24) includes an output buffer 15 (25) of high driving ability and an output buffer 16 (26) of low driving ability.

When low, a low-active chip select signal *CS ("*" represents negation) selects either one of the two memory chips. A memory address signal is input to both chips and latched in the address latch 11 (21) to address and read one of a plurality of memory cells constituting the memory cell array 12 (22). Data read from the cell addressed by the the address latch 11 (21) is latched in the output data latch 13 (23) and then output through the output circuit 14 (24). The outputs of the output circuits 14 and 24 are wire-ORed to form a data bus.

Figure 8:
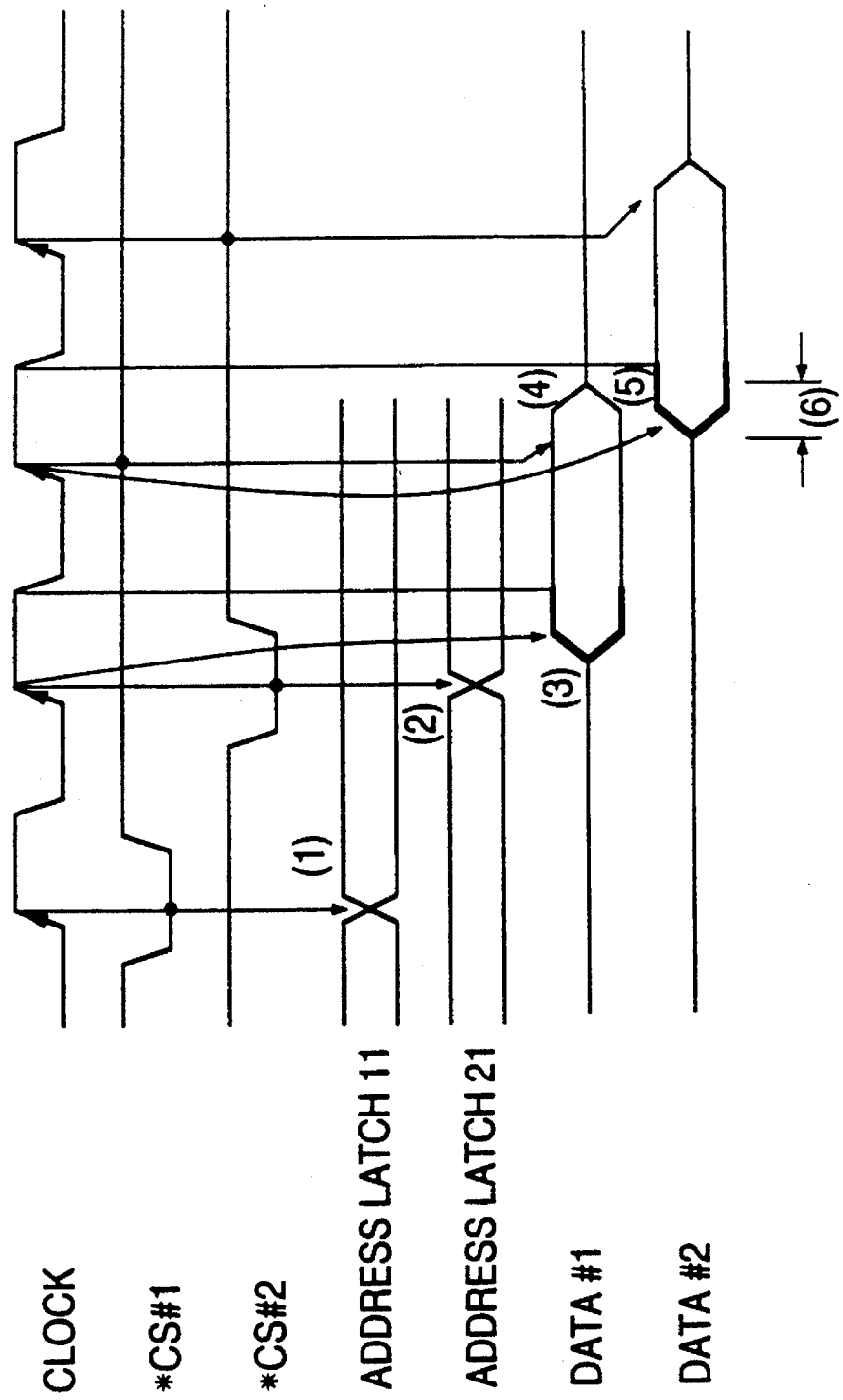
FIG. 8 is a timing chart showing an operation of a memory device embodying the present invention.

FIG. 8 is a timing chart showing an operation of a memory device embodying the present invention.

When the chip select signal *CS for the chip 1 (represented as *CS #1) goes low, the incoming memory address signal is latched in the address latch 11 at the leading edge of the clock signal and a memory read operation is started on the memory cell array 12.

Subsequently, when the *CS #2 goes low, the memory address signal is latched in the address latch 21 at the leading edge of the clock signal and a memory read operation is started on the memory cell array 22.

About one clock cycle later, data read from the chip 1 is latched in the output data latch 13 and the data-out signal (represented as data #1) is output via the output circuit 14 onto the data bus. The data #1 is output via the output buffer 15, of high driving ability, while the clock signal is high (shown by a heavy line), and via the output buffer 16, of low driving ability, while the clock signal is low (shown by a fine line).

Another clock cycle later when *CS #1 is high, the output circuit 14 disables the output (or put the output in a three state) at the leading edge of the clock pulse.

For chip 2, as is the case with chip 1, data #2 is latched in the output data latch 23 and output via the output circuit 24 onto the data bus. The data #2 is output via the output buffer 25, of high driving ability, while the clock signal is high (shown by a heavy line), and via the output buffer 26, of low driving ability, while the clock signal is low (shown by a fine line).

Thus, in period (6), data #1 and data #2 collide with each other on the data bus, causing a bus fight.

However, the bus fight does not cause a damage to the output circuits 14 and 24 because, while the output buffers 16 and 25, being of low driving ability and high driving ability respectively, are activated together, the output buffers 15 and 25, both being of high driving ability, are never activated simultaneously.

The largest possible current occurs when data #1 and data #2 are logical 1 (high) and logical 0 (low), respectively. That is, referring to FIGS. 5 and 7, the largest current flows from the chip-2 power source Vcc into the chip-1 ground through the chip-2 transistor Tr3, data bus and chip-1 transistor Tr2. Assuming that the power source Vcc is plus 5 volts, the ohmic resistance of a transistor (e.g., Tr3) for an output buffer of high driving ability is 5 ohms and that the ohmic resistance of a transistor (e.g., Tr2) for an output buffer of low driving ability is 95 ohms, only a 50 milli-ampere of current flows through the transistors. This is not sufficient to cause damage to the transistors.

Whereas, if a bus fight is caused by two output buffers of high driving ability, a heavy current may flow from a power source Vcc into a ground through two transistors of the respective output buffers. That is because a transistor used for an output buffer of high driving ability has inherently small ohmic resistance to allow a large current to flow. Assuming that the ohmic resistance of a transistor for an output buffer of high driving ability is 5 ohms, a current as large as about 500 milli-amperes may flow through the transistors, causing damage to the transistors.

As is apparent by the above description, an output circuit of the present invention drives the loads first by an output buffer of high driving ability to establish an output level fast and then by that of low driving ability to maintain the level, allowing a high-speed propagation of a signal with less power consumption and without being damaged by a bus fight.

What is claimed is:

1. An output circuit for driving a load connected to an output terminal thereof in accordance with an input signal input to an input terminal thereof, said output circuit comprising:

an output buffer, which is connected to the input and the output terminals and which, when activated, is capable of operating with, selectively, one of a high driving ability and a low driving ability;

means for generating a control signal when the input signal is input; and activation means for activating said output buffer to operate with the high driving ability for a selected period in response to said control signal and, after the selected period, with the low driving ability.

2. An output circuit according to claim 1, wherein:

the output circuit is included in a synchronous-type memory device which inputs a clock signal, the clock signal providing the control signal; and said activation means and said connection means operate in accordance with a signal level of the clock signal.

3. An output circuit for use in a synchronous-type memory device which inputs a clock signal, the output circuit for driving a load connected to an output terminal thereof in accordance with an input signal input to an input terminal thereof, said output circuit comprising:

a first output buffer which is operatively connected to the input and the output terminals;

a second output buffer which has a driving ability higher than a driving ability of said first output buffer and is operatively connected to the input terminal;

means for generating a control signal during a predetermined period immediately after the input signal is input; and connection means for selectively connecting the output terminal to said second output buffer for the predetermined period in response to said control signal and in accordance with a signal level of the clock signal being high or low.

4. An output circuit according to claim 3, wherein:

the clock signal provides the control signal.

5. An output circuit for driving a load connected to an output terminal thereof in accordance with an input signal having positive-logic and negative-logic input signals, the input signals applied to an input terminal thereof, said output circuit comprising:

a clock signal providing a control signal during a predetermined period after the input signal is input;

a first output buffer operatively connected to the input and output terminals having first and second transistors connected in series between first and second power sources with a midpoint between said first and said second transistors as an output thereof, said first and said second transistors being responsive to the positive-logic and the negative-logic input signals, respectively;

a second output buffer connected in parallel to said first output buffer and, when activated, operates with a driving ability higher than said first output buffer, said second output buffer having third and fourth transistors connected in series between the first and the second power sources with a midpoint between said third and said fourth transistors as an output thereof, said third and said fourth transistors each having ohmic resistance smaller than said first and said second transistors;

activation means for selectively activating said second output buffer for the predetermined period in response to the control signal, said activation means having a fifth and sixth transistors, said fifth transistor being responsive to the clock signal and the positive-logic input signal and said sixth transistor being responsive to the clock signal and the negative-logic input signal; and said third and said fourth transistors being responsive to said fifth and said sixth transistors, respectively.

6. An output circuit for use in a synchronous-type memory device which inputs a clock signal, the output circuit for driving a load connected to an output terminal thereof in accordance with an input signal input applied to an input terminal thereof, said output circuit comprising:

a first output buffer which is operatively connected to the input and the output terminals;

a second output buffer which is connected in parallel to said first output buffer and, when activated, operates with driving ability higher than said first output buffer;

the clock signal providing a control signal during a predetermined period after the input signal is input; and activation means for selectively activating said second output buffer for the predetermined period in accordance with a signal level of the clock signal being high or low.

7. An output circuit for use in a synchronous-type memory device which inputs a clock signal, the output circuit for driving a load connected to an output terminal thereof in accordance with an input signal input to an input terminal thereof, said output circuit comprising:

a first output buffer which is operatively connected to the output terminal;

a second output buffer which has driving ability higher than said first output buffer and is operatively connected to the input terminal; and connection means operating in accordance with a signal level of the clock signal being high or low for operatively connecting the output terminal to said second output buffer for a predetermined period when the input signal is input and, after the period, to said first output buffer.

* * * * *